(12) United States Patent
Lo

(10) Patent No.: US 9,105,674 B2
(45) Date of Patent: Aug. 11, 2015

(54) STEPPED ELASTIC POSITIONING STRUCTURE FOR A SEMICONDUCTOR CARRIER

(71) Applicant: Yu-Nan Lo, Taichung (TW)

(72) Inventor: Yu-Nan Lo, Taichung (TW)

( * ) Notice: Subject to any disclaimer, the term of this patent is extended or adjusted under 35 U.S.C. 154(b) by 66 days.

(21) Appl. No.: 14/071,640

(22) Filed: Nov. 4, 2013

(65) Prior Publication Data

US 2015/0122698 A1 May 7, 2015

(51) Int. Cl.
*H01L 21/677* (2006.01)
*B65D 5/50* (2006.01)
*B65D 1/36* (2006.01)
*H01L 21/673* (2006.01)

(52) U.S. Cl.
CPC ............ *H01L 21/67769* (2013.01); *B65D 1/36* (2013.01); *B65D 5/50* (2013.01); *H01L 21/67333* (2013.01); *H01L 21/67766* (2013.01)

(58) Field of Classification Search
CPC .. B65D 1/36; B65D 5/5011; H01L 21/67333; H01L 2221/68313; H01L 21/67766; H01L 21/67769

USPC ......... 206/488, 560, 565, 714, 722, 724, 725, 206/726, 728; 29/762; 439/331
See application file for complete search history.

(56) References Cited

U.S. PATENT DOCUMENTS

| | | | | |
|---|---|---|---|---|
| 4,549,651 A | * | 10/1985 | Alemanni | 206/724 |
| 4,620,632 A | * | 11/1986 | Alemanni | 206/724 |
| 4,765,471 A | * | 8/1988 | Murphy | 206/728 |
| 5,080,228 A | * | 1/1992 | Maston et al. | 206/722 |
| 5,375,710 A | * | 12/1994 | Hayakawa et al. | 206/724 |
| 5,526,936 A | * | 6/1996 | Matsuzoe | 206/724 |
| 6,612,442 B2 | * | 9/2003 | Soh et al. | 206/725 |

\* cited by examiner

*Primary Examiner* — Bryon Gehman
(74) *Attorney, Agent, or Firm* — Patent Office of Bang Shia

(57) ABSTRACT

A stepped elastic positioning structure for a semiconductor carrier includes a plurality of transversely and longitudinally arranged walls and a plurality of recesses defined by the walls. On the walls of the semiconductor carrier is formed a plurality of L-shaped stop blocks, each of the stop blocks has an elastically deformable free end which is capable of elastically restricting the semiconductor in the recess, and improving the easiness for putting in or taking out the semiconductor. The end of each of the stop blocks is a stepped structure, plus the elastic deformability of the stop blocks, which makes the recess capable of holding different sized semiconductors.

7 Claims, 7 Drawing Sheets

STEPPED ELASTIC POSITIONING STRUCTURE FOR A SEMICONDUCTOR CARRIER

BACKGROUND OF THE INVENTION

1. Field of the Invention

The present invention relates to a semiconductor carrier, and more particularly to a stepped elastic positioning structure for a semiconductor carrier.

2. Description of the Prior Art

Referring to FIG. 1, a conventional semiconductor carrier 10 includes a plurality of walls 11 arranged in a matrix manner to define a plurality of recesses 12 for holding and protecting semiconductors. Each of the recesses 12 is an upstanding wall 121 and an oblique wall 122 connected to the upstanding wall 121 and extending toward the recess 12, so that the peripheral surface of the semiconductor A can be clamped by the oblique wall 122 and positioned on the bottom 123 of the recess 12, preventing the pin A1 of the semiconductor A from getting into contact with the bottom 123 of the recess 12.

It is to be noted that there is interval left between the semiconductor A and the upstanding wall 121 when the semiconductor A is received the recess 12, so as to prevent the semiconductor A from getting stuck in the recess 12, thus facilitating putting semiconductor into and taking it out of the recess 12. However, the semiconductor carrier 10 is used to carry a plurality of micro semiconductors A, and when the semiconductors A are not positioned well, even slight vibration might cause disengagement of the semiconductor A from the recess 12, causing unnecessary damage. Furthermore, the existing recesses 12 are only capable of holding similarly sized semiconductors A due to the fact that a relatively large semiconductor A may get stuck in the recess 12, and a small semiconductor A is very likely to disengage from the recess 12.

The present invention has arisen to mitigate and/or obviate the afore-described disadvantages.

SUMMARY OF THE INVENTION

The primary objective of the present invention is to provide a stepped elastic positioning structure for a semiconductor carrier, on the walls of the semiconductor carrier is formed a plurality of L-shaped stop blocks, each of the stop blocks has an elastically deformable free end which is capable of elastically restricting the semiconductor in the recess, and improving the easiness for putting in or taking out the semiconductor.

Another objective of the present invention is to provide a stepped elastic positioning structure for a semiconductor carrier, on the walls of the semiconductor carrier is formed a plurality of L-shaped stop blocks, the end of each of the stop blocks is a stepped structure, plus the elastic deformability of the stop blocks, which makes the recess capable of holding different sized semiconductors.

To achieve the above objectives, a stepped elastic positioning structure for a semiconductor carrier in accordance with the present invention comprises: a plurality of transversely and longitudinally arranged walls, and a plurality of recesses defined by the walls, the stepped elastic positioning structure is formed on the walls and located in the recesses, the stepped elastic positioning structure in the respective recesses comprises: a plurality of L-shaped stop blocks each including a connecting section connected to the walls, and an abutting section connected to the connecting section, and further including an upper surface and a lower surface. The abutting section is provided between the upper and lower surfaces with a stepped structure which includes a stepped surface, the stepped surface includes a first surface connected to the upper surface and a second surface connected to the lower surface, and the lower surface of the respective stop blocks has a width larger than a width of the upper surface.

Preferably, the walls are first walls and second walls which are perpendicular to the first walls, and on a same first wall are provided two stop blocks, or on a same first wall are provided two stop blocks, and on a same second wall are provided another two stop blocks.

Preferably, the abutting section of the stop block includes a stepped block which is provided on a top thereof with the stepped surface, on the stepped surface is formed a first protrusion which is provided with the first surface, the stepped block is provided with a second protrusion which is located corresponding to the first surface, and the second surface is formed on the second protrusion, the first surface includes a first upstanding wall connected to the stepped surface and a first oblique wall connected to the first upstanding wall and the upper surface, and the second surface includes a second upstanding wall connected to the lower surface and a second oblique wall connected to the second upstanding wall and the stepped surface.

Preferably, the first surface of the first protrusion is formed with the first upstanding wall connected to the first surface, the first oblique wall connected to the first upstanding wall and the upper surface, the second surface of the second protrusion is formed with the second upstanding wall connected to the lower surface, and the second oblique wall connected to the second upstanding wall and the stepped surface.

DETAILED DESCRIPTION OF THE PREFERRED EMBODIMENTS

Figure 1:
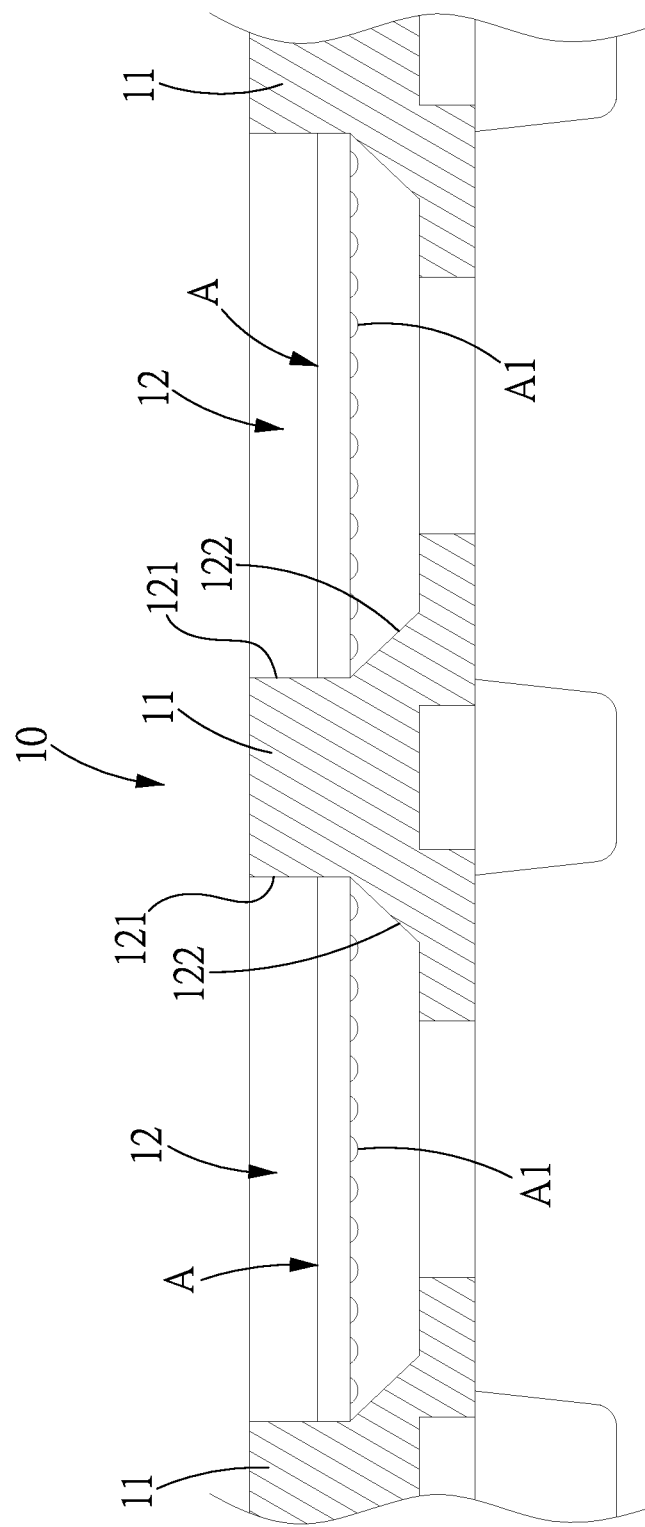
FIG. 1 is a cross sectional view of a conventional semiconductor carrier.

The present invention will be clearer from the following description when viewed together with the accompanying drawings, which show, for purpose of illustrations only, the preferred embodiment in accordance with the present invention.

Referring to FIGS. 2-7, a stepped elastic positioning structure for a semiconductor carrier 20 in accordance with the present invention comprises: a plurality of transversely and longitudinally arranged walls 21, 22, and a plurality of recesses 30 defined by the walls 21, 22 and arranged in a matrix manner. The stepped elastic positioning structure is formed on the walls 21, 22 and located in the recesses 30. The walls 21 are defined as first walls 21 and the walls 22 are defined as second walls 22 which are perpendicular to the first walls 21. Each of the recesses 30 includes a shoulder portion 33 at the conjunction between a bottom surface 31 and the first and second walls 21, 22. The shoulder portion 33 includes a top surface 331 and an abutting surface 332. In this embodiment, the semiconductor carrier 20 is made of elastic material, and the stepped elastic positioning structure is integrally formed on the walls 21, 22 of the semiconductor carrier 20.

The elastic positioning structure of the respective recesses 30 includes a plurality of L-shaped stop blocks 40. Each of the stop blocks 40 includes a connecting section 401 connected to the walls 21, 22, and an abutting section 402 connected to the connecting section 401, and further includes an upper surface 403 and a lower surface 404. The abutting section 402 is provided between the upper and lower surfaces 403, 404 with a stepped structure which includes a stepped surface 41. The stepped surface 41 includes a first surface 42 connected to the upper surface 403 and a second surface 43 connected to the lower surface 404, and the lower surface 404 of the respective stop blocks 40 has a width W2 larger than a width W1 of the upper surface 403.

Figure 2:
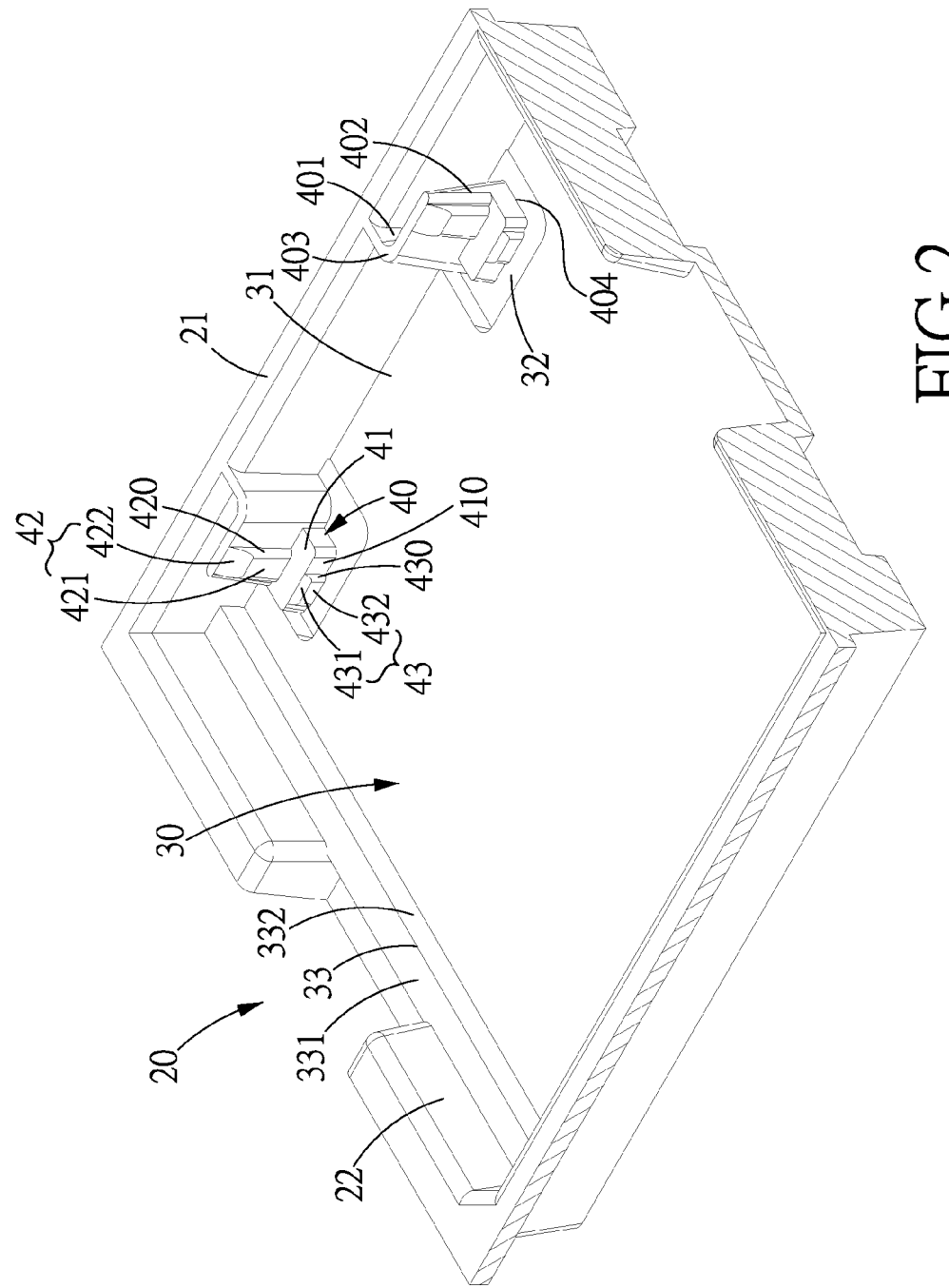
FIG. 2 is a perspective view of a stepped elastic positioning structure for a semiconductor carrier in accordance with the present invention.
Figure 5:
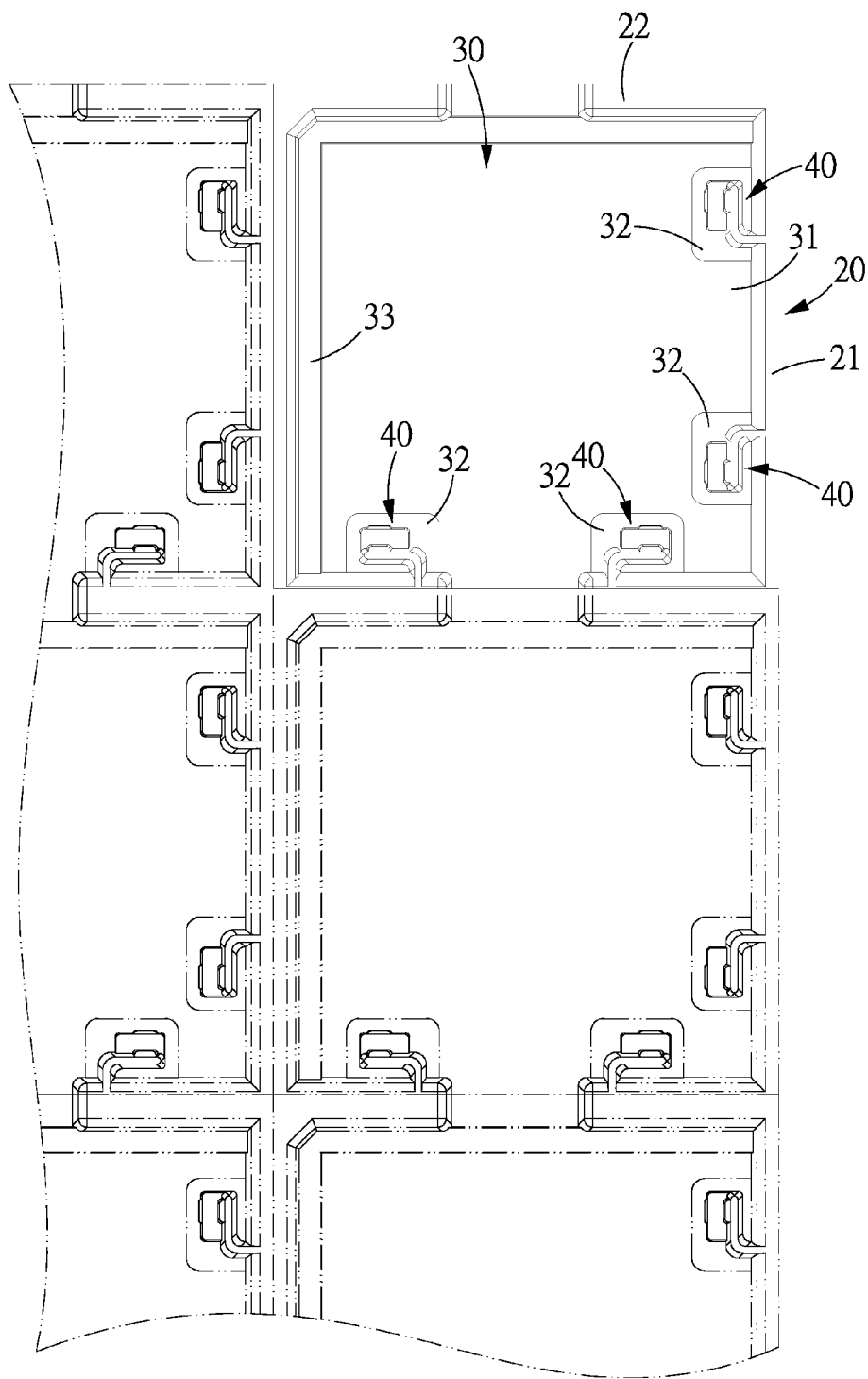
FIG. 5 is a top view of the present invention showing that stop blocks are formed on two neighboring walls of the recess of the stepped elastic positioning structure for the semiconductor carrier.
Figure 6:
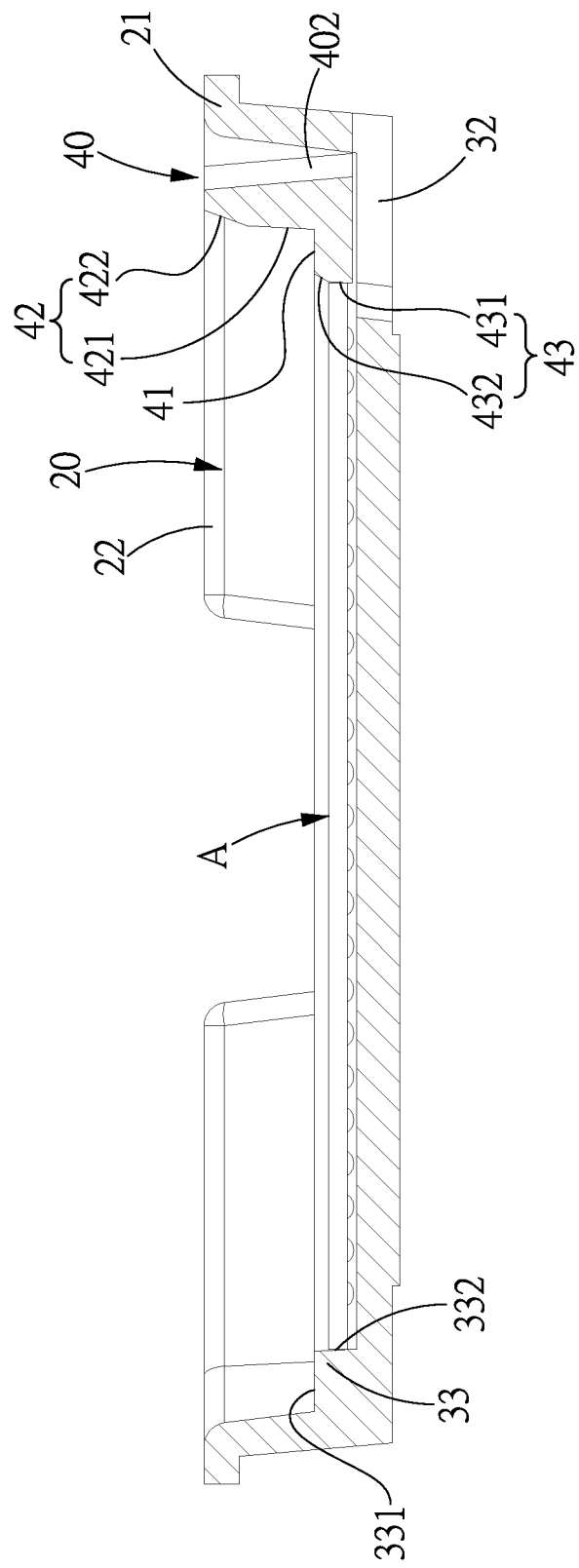
FIG. 6 is a cross sectional view of the present invention showing that a small semiconductor is disposed at the bottom of the recess of the stepped elastic positioning structure for the semiconductor carrier.
Figure 7:
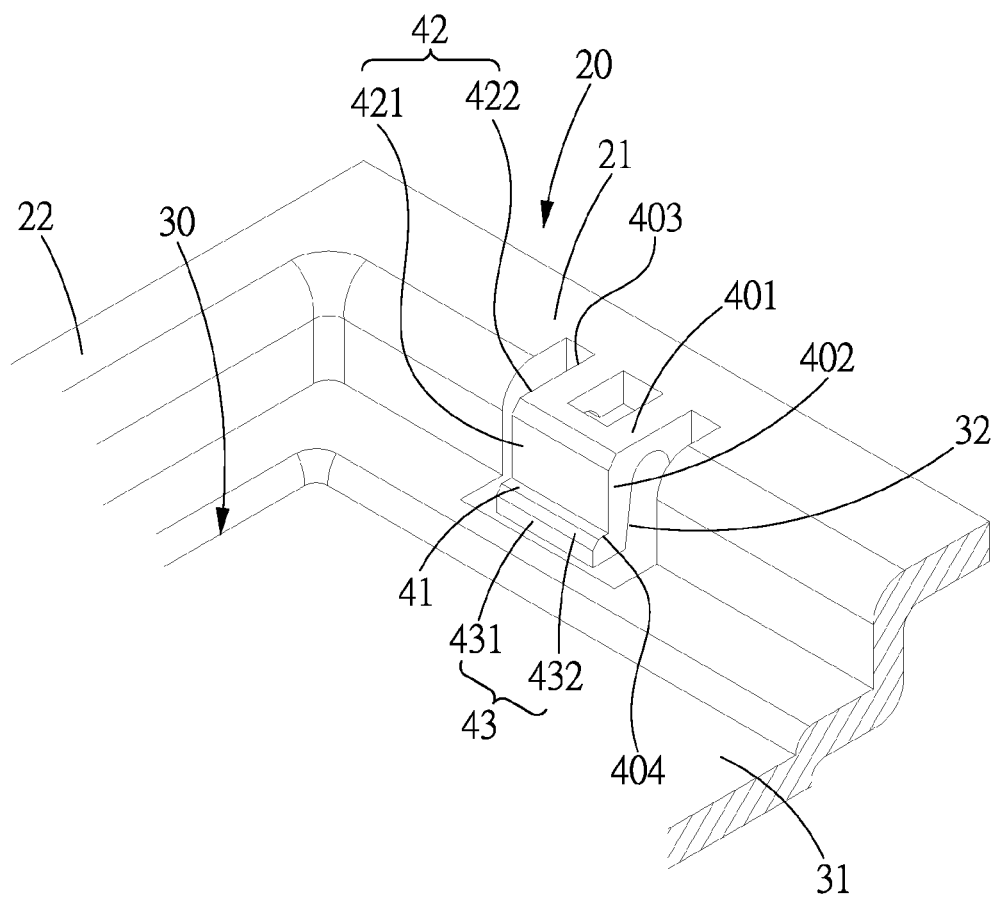
FIG. 7 is a perspective view of a stepped elastic positioning structure for a semiconductor carrier in accordance with another embodiment of the present invention.

The configuration of each of the stop blocks 40 of the semiconductor carrier 20 is shown in FIG. 7, wherein the first surface 42 of the stop block 40 includes a first upstanding wall 421 connected to the stepped surface 41 and a first oblique wall 422 connected to the first upstanding wall 421 and the upper surface 403. The second surface 43 of each of the stop blocks 40 includes a second upstanding wall 431 connected to the lower surface 404 and a second oblique wall 432 connected to the second upstanding wall 431 and the stepped surface 41. Or, each of the stop blocks 40 of the semiconductor carrier 20 can be configured as shown in FIGS. 2, 5 and 6, wherein the abutting section 402 of the stop block 40 includes a stepped block 410 which is provided on a top thereof with the stepped surface 41, on the stepped surface 41 is formed a first protrusion 420 which is provided with the first surface 42, the stepped block 410 is provided with a second protrusion 430 which is located corresponding to the first surface 42, and the second surface 43 is formed on the second protrusion 430. By such arrangements, the semiconductors A can be firmly positioned by the stop blocks 40, meanwhile, the stop blocks 40 would have less contact area with the semiconductors A, preventing the stop blocks 40 from clamping the semiconductors A too tightly and causing abrasion.

As shown in FIG. 2, the first surface 42 of the first protrusion 420 is formed with the first upstanding wall 421 connected to the first surface 42, and the first oblique wall 422 connected to the first upstanding wall 421 and the upper surface 403. The second surface 43 of the second protrusion 430 is formed with the second upstanding wall 431 connected to the lower surface 404, and the second oblique wall 432 connected to the second upstanding wall 431 and the stepped surface 41. All these arrangements improve the easiness of putting the semiconductor A into the recess or taking it out of the recess 30.

The L-shaped stop blocks 40 of the present invention is configured as shown in FIG. 2, the connecting section 401 extends from one wall 21, 22 toward an opposite wall 21, 22. The abutting section 402 extends along one of the walls 21, 22 and is parallel to the bottom surface 31 of the recess 30, and the bottom surface 31 of the recess 30 is formed with a plurality of openings 32 at the location of the stop blocks 40. Or, as shown in FIG. 7, the connecting section 401 of each of the stop blocks 40 extends from one wall 21, 22 toward an opposite wall 21, 22. The abutting section 402 extends toward the bottom surface 31 of the recess 30, and the wall 21, 22 on which the stop block 40 being formed is formed with a plurality of openings 23 at the location of the stop blocks 40. The openings 23, 32 allow the stop blocks 40 to be deformed elastically when the stop blocks 40 are pressed by the semiconductors A.

Figure 4:
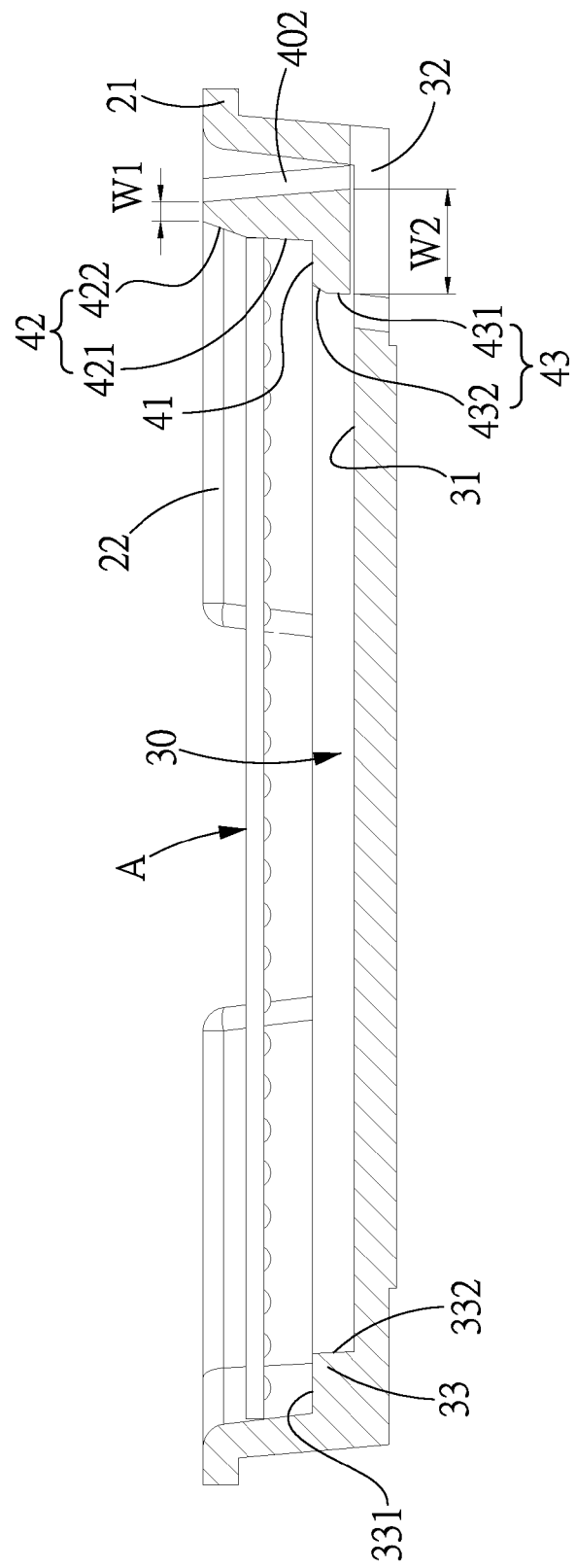
FIG. 4 is a cross sectional view of the present invention showing that a large semiconductor is disposed at the upper portion of the recess of the stepped elastic positioning structure for the semiconductor carrier.

Referring to FIGS. 4 and 5, the first and second surfaces 42, 43 of the stop blocks 40 cooperate with the walls 21, 22 to define a stepped recess to accommodate different sized semiconductors. When the recess 30 is provided with the shoulder portion 33, the second surface 43 of each of the stop blocks 40 is located at the same level of the abutting surface 332 of the shoulder portion 33, so that when different sized semiconductors A are inserted along the first oblique wall 422 of the first surface 42 into the recess 30, a relatively big semiconductor A can be located in the upper portion of the recess 30 and clamped by the first upstanding wall 421 of the stop blocks 40 and the walls 21, 22, as shown in FIG. 4. A. For a relatively small semiconductor A, as shown in FIG. 6, the second oblique wall 432 of the second surface 43 of the stop block 40 can be elastically pressed into the opening 23, 32, so that the semiconductor A can be clamped between the abutting surface 332 of the shoulder portion 33 of the recess 30 and the second upstanding wall 431 of the stop blocks 40. By such arrangements, the semiconductor carrier 20 of the present invention is capable of carrying different sized semiconductors A. It is to be noted that, with the elastic and stepped structure of the positioning structure of the present invention, the semiconductors A still can be firmly positioned even when the sizes of the semiconductors A are slightly different due to manufacturing tolerance.

The L-shaped design of the stop block of the present invention makes the abutting section 402 elastically deformable, providing better elastic positioning of the semiconductor A. furthermore, with the design of the stepped structure and the elastic free end of the stop block 40, the present invention is capable of holding different sized semiconductors.

Figure 3:
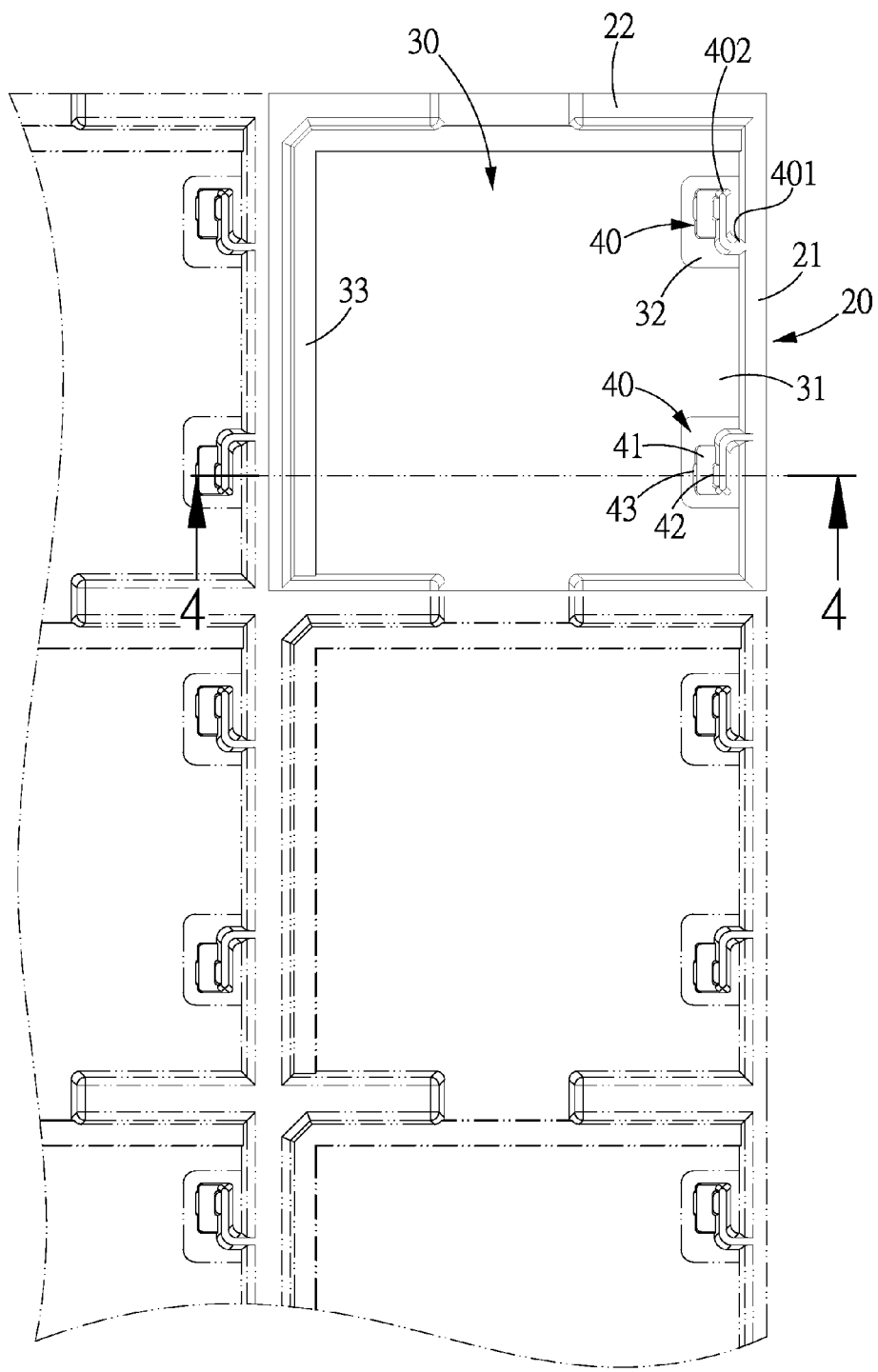
FIG. 3 is a top view of the stepped elastic positioning structure for a semiconductor carrier in accordance with the present invention.

There can be two stop blocks 40 on a same first wall 21 of each of the recesses 30, as shown in FIG. 3. Or, two stop blocks 40 on a same first wall 21, and another two stop blocks 40 on a same second wall 22, as shown in FIG. 5, and the abutting sections 402 of two neighboring stop blocks 40 on the same wall 21, 22 extends toward an opposite wall 21, 22, so as to provide better elastic positioning of the semiconductor A.

While we have shown and described various embodiments in accordance with the present invention, it is clear to those skilled in the art that further embodiments may be made without departing from the scope of the present invention.

What is claimed is:

1. A stepped elastic positioning structure for a semiconductor carrier, comprising: a plurality of transversely and longitudinally arranged walls, and a plurality of recesses defined by the walls, the stepped elastic positioning structure being formed on the walls and located in the recesses, the stepped elastic positioning structure in the respective recesses comprising:

a plurality of L-shaped stop blocks each including a connecting section connected to the walls, and an abutting section connected to the connecting section, and further including an upper surface and a lower surface, the abutting section being provided between the upper and lower surfaces with a stepped structure which includes a stepped surface, the stepped surface including a first surface connected to the upper surface and a second surface connected to the lower surface, and the lower surface of the respective stop blocks having a width larger than a width of the upper surface;

wherein the abutting section of each of the stop blocks includes a stepped block which is provided on a top thereof with the stepped surface, on the stepped surface is formed a first protrusion which is provided with the first surface, the stepped block is provided with a second protrusion which is located corresponding to the first surface, and the second surface is formed on the second protrusion, the first surface includes a first upstanding wall connected to the stepped surface and a first oblique wall connected to the first upstanding wall and the upper surface, and the second surface includes a second upstanding wall connected to the lower surface and a second oblique wall connected to the second upstanding wall and the stepped surface.

2. The stepped elastic positioning structure for the semiconductor carrier as claimed in claim 1, wherein the first surface of the first protrusion is formed with the first upstanding wall connected to the first surface, the first oblique wall connected to the first upstanding wall and the upper surface, the second surface of the second protrusion is formed with the second upstanding wall connected to the lower surface, and the second oblique wall connected to the second upstanding wall and the stepped surface.

3. The stepped elastic positioning structure for the semiconductor carrier as claimed in claim 1, wherein the connecting section extends from one wall toward an opposite wall, the abutting section extends along one of the walls and is parallel to a bottom surface of each of the recesses, and the bottom surface of the recess is formed with a plurality of openings at the stop blocks.

4. The stepped elastic positioning structure for the semiconductor carrier as claimed in claim 1, wherein the connecting section of each of the stop blocks extends from one wall toward an opposite wall, the abutting section extends toward a bottom surface of each of the recesses, and the wall on which each of the stop blocks is formed with a plurality of openings at the stop blocks.

5. The stepped elastic positioning structure for the semiconductor carrier as claimed in claim 1, wherein the walls are first walls and second walls which are perpendicular to the first walls, and on each of the first walls are provided two stop blocks.

6. The stepped elastic positioning structure for the semiconductor carrier as claimed in claim 1, wherein the walls are first walls and second walls which are perpendicular to the first walls, on each of the first walls are provided two stop blocks, and on each of the second walls are provided another two stop blocks.

7. The stepped elastic positioning structure for the semiconductor carrier as claimed in claim 1, wherein the walls are first walls and second walls which are perpendicular to the first walls, each of the recesses includes a shoulder portion at the conjunction between a bottom surface and the first and second walls, and the shoulder portion includes a top surface and an abutting surface.

* * * * *